(12) United States Patent
Park et al.

(10) Patent No.: US 12,457,834 B2
(45) Date of Patent: Oct. 28, 2025

(54) DISPLAY DEVICE

(71) Applicant: Samsung Display Co., Ltd., Yongin-si (KR)

(72) Inventors: Hyun Ae Park, Hwaseong-si (KR); Kyoung Jin Park, Hwaseong-si (KR); Chae Han Hyun, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 384 days.

(21) Appl. No.: 18/093,252

(22) Filed: Jan. 4, 2023

(65) Prior Publication Data

US 2023/0246150 A1 Aug. 3, 2023

(30) Foreign Application Priority Data

Jan. 28, 2022 (KR) .......................... 10-2022-0013639

(51) Int. Cl.
*H10H 20/857* (2025.01)
*H10H 20/831* (2025.01)

(52) U.S. Cl.
CPC ...... *H10H 20/857* (2025.01); *H10H 20/8312* (2025.01)

(58) Field of Classification Search
None
See application file for complete search history.

(56) References Cited

U.S. PATENT DOCUMENTS

| | | | |
|---|---|---|---|
| 2007/0085847 A1* | 4/2007 | Shishido | G09G 3/3225 345/39 |
| 2020/0168147 A1* | 5/2020 | Na | G09G 3/3266 |
| 2021/0265442 A1* | 8/2021 | Cho | H10K 59/1213 |
| 2021/0265449 A1 | 8/2021 | Son et al. | |
| 2022/0045147 A1* | 2/2022 | Kim | H10K 71/231 |
| 2023/0063106 A1* | 3/2023 | Kim | H10K 59/1216 |

FOREIGN PATENT DOCUMENTS

| | | | | |
|---|---|---|---|---|
| CN | 110660355 A | * | 1/2020 | ........... G09G 3/3266 |
| CN | 111192528 A | * | 5/2020 | ........... G09G 3/3225 |
| CN | 113130544 A | * | 7/2021 | ............. H10D 86/60 |
| CN | 113363287 A | * | 9/2021 | ........... H10K 59/131 |
| CN | 114519978 A | * | 5/2022 | ........... H10K 59/126 |

(Continued)

*Primary Examiner* — Michael Lebentritt
(74) *Attorney, Agent, or Firm* — Womble Bond Dickinson (US) LLP

(57) ABSTRACT

A display device comprises a substrate, a first channel above the substrate, a first gate electrode overlapping the first channel, a storage electrode above the first gate electrode, a first connection electrode above the storage electrode, and connected with the first gate electrode, a third channel of a third transistor above the substrate, and a second scan line including a third gate electrode overlapping the third channel, wherein the third transistor includes a second electrode connected with the first connection electrode, and wherein the second scan line includes a first portion including the third gate electrode, and extending in a first direction, a second portion bent from the first portion, and extending in a second direction in parallel with a first side of the storage electrode, and a third portion bent from the second portion, and extending in the first direction in parallel with a second side of the storage electrode.

20 Claims, 14 Drawing Sheets

(56) References Cited

FOREIGN PATENT DOCUMENTS

| EP | 3579279 A1 | * | 12/2019 | ........... H10K 59/131 |
|----|------------|---|---------|-------------------------|
| JP | 2007140488 A | * | 6/2007 | |
| KR | 10-2015-0124922 A | | 11/2015 | |
| KR | 20180112193 A | * | 10/2018 | ....... H01L 29/78696 |
| KR | 20190031403 A | * | 3/2019 | ........... G09G 3/3291 |
| KR | 10-2019-0143549 A | | 12/2019 | |
| KR | 10-2019-0143806 A | | 12/2019 | |
| KR | 10-2020-0073347 A | | 6/2020 | |
| KR | 10-2021-0108536 A | | 9/2021 | |
| KR | 20210149960 A | * | 12/2021 | ......... H10D 30/6755 |
| KR | 20220018117 A | * | 2/2022 | ............ H10D 86/60 |
| KR | 20230074342 A | * | 5/2023 | ........... G09G 3/3233 |
| WO | WO-2019245173 A1 | * | 12/2019 | ........ H10K 59/1315 |

* cited by examiner

DISPLAY DEVICE

CROSS-REFERENCE TO RELATED APPLICATION

This application claims priority to, and the benefit of, Korean Patent Application No. 10-2022-0013639 filed in the Korean Intellectual Property Office on Jan. 28, 2022, the entire contents of which are incorporated herein by reference.

BACKGROUND

1. Field

The present disclosure relates to a display device.

2. Description of the Related Art

A light emitting display device includes a light emitting diode formed of two electrodes and an emission layer located between the two electrodes. An electron injected from one electrode of the light emitting diode, and a hole injected from another electrode, are combined in the emission layer to form an exciton. As the exciton changes from the exited state to the ground state, it emits energy and emits light.

The display device includes a plurality of pixels including a light emitting diode. A plurality of transistors and at least one capacitor for driving a light emitting diode are formed in each pixel.

The above information disclosed in this Background section is only for enhancement of understanding of the background of the invention, and therefore it may contain information that does not form the prior art that is already known in this country to a person of ordinary skill in the art.

SUMMARY

Embodiments facilitate high resolution by reducing an occurrence of luminance deviation of a display device, and by reducing the area occupied by a capacitor.

A display device according to one or more embodiments includes a substrate, a first channel of a first transistor above the substrate, a first gate electrode overlapping the first channel, a storage electrode above the first gate electrode to form a first capacitor therewith, a first connection electrode above the storage electrode, and electrically connected with the first gate electrode, a third channel of a third transistor above the substrate, and a second scan line including a third gate electrode overlapping the third channel, wherein the third transistor includes a second electrode electrically connected with the first connection electrode, and wherein the second scan line includes a first portion including the third gate electrode, and extending in a first direction, a second portion bent from the first portion, and extending in a second direction, which is different from the first direction, in parallel with a first side of the storage electrode, and a third portion bent from the second portion, and extending in the first direction in parallel with a second side of the storage electrode.

The second scan line may be separated from the first connection electrode in plan view.

An imaginary extension line of the first portion of the second scan line may pass the storage electrode.

An imaginary extension line of the first portion of the second scan line may pass the first connection electrode.

The first connection electrode may include a portion extending in a direction that is oblique to the first direction and to the second direction.

The display device may further include a first semiconductor layer above the substrate, and including the first channel, and a second semiconductor layer above the first semiconductor layer, and including the third channel.

The second scan line may include respective portions overlapping the first semiconductor layer and the second semiconductor layer.

The second portion of the second scan line may overlap the first semiconductor layer, wherein the first semiconductor layer has conductivity.

The display device may further include a data line above the substrate, a second transistor electrically connected with the data line, and a first scan line including a second gate electrode overlapping a second channel of the second transistor, and a portion overlapping the second semiconductor layer.

A first boost electrode of the first scan line may form a second capacitor with a second boost electrode of the second semiconductor layer.

A display device according to one or more embodiments includes a substrate, a first semiconductor layer including a first channel of a first transistor above the substrate, a first gate conductive layer including a first gate electrode overlapping the first channel, a second semiconductor layer above the first gate conductive layer, and including a third channel of a third transistor, a third gate conductive layer including a second scan line including a third gate electrode overlapping the third channel, and a first data conductive layer including a first connection electrode above the third gate conductive layer and electrically connected with a first gate electrode, wherein the second scan line overlaps a first conductive area of the first semiconductor layer, and is separated from the first connection electrode in plan view.

The second scan line may include a first portion including the third gate electrode, and extending in a first direction, a second portion bent from the first portion, and extending in a second direction that is different from the first direction, and a third portion bent from the second portion, and extending in the first direction.

The display device may further include a storage electrode above the first gate electrode, and forming a first capacitor therewith, wherein the second portion extends in parallel with a first side of the storage electrode, and wherein the third portion extends in parallel with a second side of the storage electrode.

An imaginary extension line of the first portion of the second scan line may pass the storage electrode.

The second portion of the second scan line may overlap the first semiconductor layer.

The display device may further include a data line above the substrate, a second transistor electrically connected with the data line, and a first scan line including a second gate electrode overlapping a second channel of the second transistor, and a portion overlapping the second semiconductor layer.

A first boost electrode of the first scan line may form a second capacitor with a second boost electrode of the second semiconductor layer.

The second boost electrode of the second semiconductor layer may be electrically connected with the first connection electrode.

A display device according to one or more embodiments includes a substrate, a first channel of a first transistor above the substrate, a first gate electrode overlapping the first channel, a first connection electrode electrically connected with the first gate electrode, a third channel of a third transistor above the substrate, and a second scan line including a third gate electrode overlapping the third channel, wherein the third transistor includes a second electrode electrically connected with the first connection electrode, and wherein the second scan line is separated from the first connection electrode in plan view, and includes a first portion including the third gate electrode, and extending in a first direction, a second portion bent from the first portion, and extending in a second direction that is different from the first direction, and a third portion bent from the second portion, and extending in the first direction, and wherein an imaginary extension line of the first portion of the second scan line passes the first connection electrode.

The display device may further include a storage electrode above the first gate electrode to form a first capacitor therewith, wherein the imaginary extension line of the first portion of the second scan line passes the storage electrode.

Accordingly, it may be possible to reduce the occurrence of luminance deviation of the display device, and to reduce the area occupied by the capacitor to facilitate high resolution.

DETAILED DESCRIPTION

Figure 1:
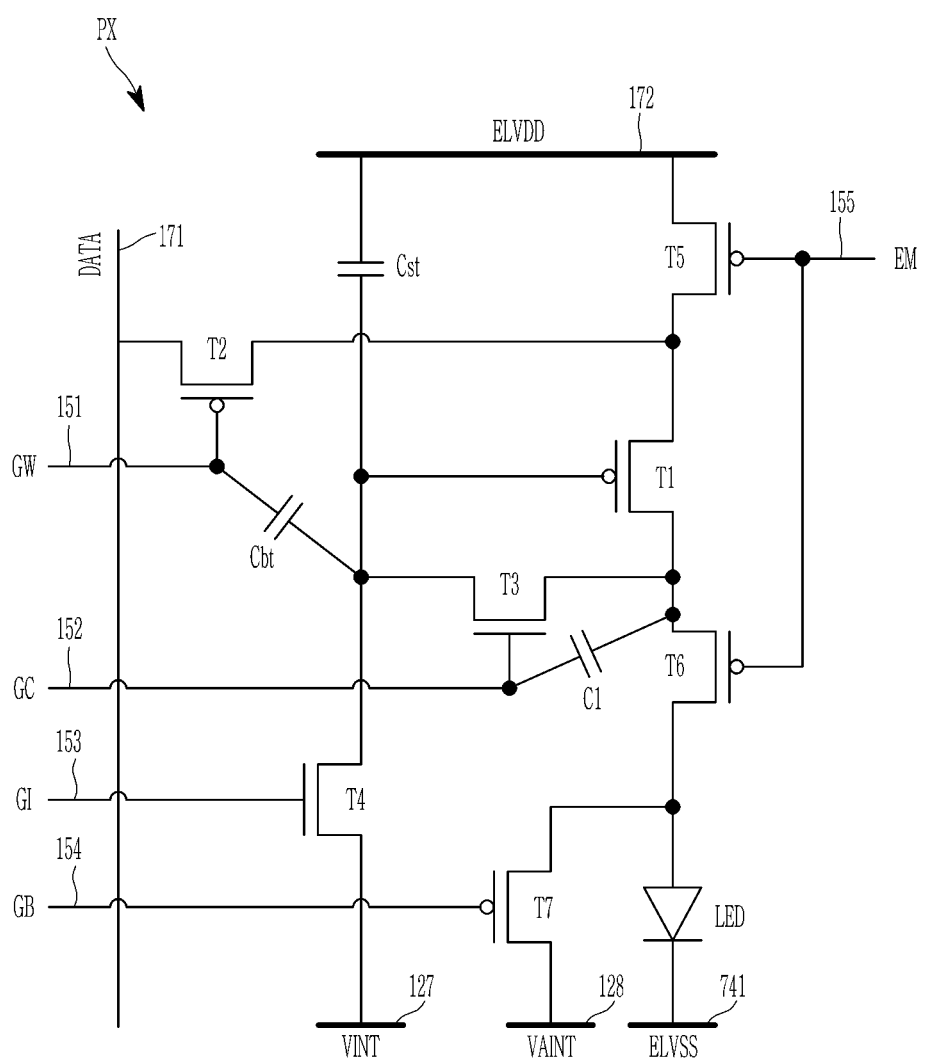
FIG. 1 is a circuit diagram of a pixel of a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side. In addition, throughout the specification, "on a plane" or "in a plan view" means when a target portion is viewed from above planes of a first direction DR1 and a second direction DR2, and "in a cross-section view" means when the cross-section cut in a third direction DR3, which is perpendicular to the first direction DR1 and second direction DR2 is viewed from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Referring to FIG. 1, a pixel of a display device according to one or more embodiments will be described.

FIG. 1 is a circuit diagram of a pixel of a display device according to one or more embodiments.

A display device according to one or more embodiments includes a display area where an image may be displayed. The display area includes a plurality of pixels PX. Each pixel PX includes a plurality of transistors T1, T2, T3, T4, T5, T6, and T7 connected to a plurality of wires 127, 128, 151, 152, 153, 154, 155, 171, 172, and 741, a first capacitor Cst, a second capacitor Cbt, and a light emitting diode LED.

The plurality of wires 127, 128, 151, 152, 153, 154, 155, 171, 172, and 741 connected to one pixel PX includes a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 is connected to a gate driver and transmits a first scan signal GW to the second transistor T2. The second scan line 152 may be applied with a voltage of opposite polarity to a voltage applied to the first scan line 151 at the same timing as a signal of the first scan line 151. For example, when a negative voltage is applied to the first scan line 151, a positive voltage may be applied to the second scan line 152. The second scan line 152 transmits a second scan signal GC to a third transistor T3.

The initialization control line 153 transmits an initialization control signal GI to the fourth transistor T4. The bypass control line 154 transmits a bypass signal GB to a seventh transistor T7. The bypass control line 154 may be a first scan line 151 in the previous stage of the pixel PX. The light emission control line 155 transmits a light emission control signal EM to a fifth transistor T5 and a sixth transistor T6.

The data line 171 transmits a data voltage DATA generated by the data driver. According to the data voltage DATA applied to the pixel PX, the luminance of the light emitting diode LED may be changed.

The driving voltage line 172 transmits a driving voltage ELVDD.

The first initialization voltage line 127 transmits a first initialization voltage VINT, and the second initialization voltage line 128 transmits a second initialization voltage VAINT. The common voltage line 741 applies a common voltage ELVSS to the cathode of the light emitting diode LED. Voltages applied to the driving voltage line 172, the first and second initialization voltage lines 127 and 128, and the common voltage line 741 may each be a constant voltage.

Hereinafter, a structure and a connection relationship of the plurality of transistors T1, T2, T3, T4, T5, T6, and T7 will be described.

The first transistor T1 may have a P-type transistor characteristic and may include a polycrystalline semiconductor. Because brightness of the light emitting diode LED is adjusted according to the intensity of the driving current output to an anode of the light emitting diode LED, luminance of the light emitting diode LED may be adjusted according to the data voltage DATA applied to the pixel PX. For this purpose, the first electrode of the first transistor T1 is located to receive the driving voltage ELVDD, and is connected to the driving voltage line 172 via the fifth transistor T5. A first electrode of the first transistor T1 is also connected to a second electrode of the second transistor T2. The second electrode of the first transistor T1 is located to output a current toward the light emitting diode LED, and is connected to the anode of the light emitting diode LED via the sixth transistor T6. The second electrode of the first transistor T1 transmits the data voltage DATA applied to the first electrode to the third transistor T3.

In the description of the present specification, first and second electrodes of a transistor mean a source region or a drain region, and are included in a conductive region of a semiconductor layer.

A gate electrode of the first transistor T1 is connected to one electrode (hereinafter, referred to as a second storage electrode) of the first capacitor Cst. A voltage of the gate electrode of the first transistor T1 may change according to a voltage stored in the first capacitor Cst, and accordingly, a driving current output from the first transistor T1 may be changed. The first capacitor Cst also serves to maintain the voltage of the gate electrode of the first transistor T1 to be constant for one frame.

The second transistor T2 may have a P-type transistor characteristic and may include a polycrystalline semiconductor. The second transistor T2 may transmit the data voltage DATA to the pixel PX. A gate electrode of the second transistor T2 is connected to the first scan line 151 and one electrode of the second capacitor Cbt (hereinafter, also referred to as a first boost electrode). The first electrode of the second transistor T2 is connected to the data line 171. A second electrode of the second transistor T2 is connected to the first electrode of the first transistor T1. When the second transistor T2 is turned on according to the first scan signal GW transmitted through the first scan line 151, the data voltage DATA transmitted through the data line 171 may be transmitted to the first electrode of the first transistor T1.

The third transistor T3 may have an N-type transistor characteristic and may include an oxide semiconductor. The third transistor T3 electrically connects the second electrode of the first transistor T1 to the gate electrode of the first transistor T1. As a result, a compensation voltage changed from the data voltage DATA through the first transistor T1 may be transmitted to a second storage electrode of the first capacitor Cst. A gate electrode of the third transistor T3 is connected to the second scan line 152, and a first electrode of the third transistor T3 is connected to the second electrode of the first transistor T1.

A second electrode of the third transistor T3 is connected with the second storage electrode of the first capacitor Cst, the gate electrode of the first transistor T1, and the other electrode (hereinafter, referred to as a second boost electrode) of the second capacitor Cbt. The third transistor T3 is turned on according to a second scan signal GC received through the second scan line 152, connects the gate electrode of the first transistor T1 to the second electrode of the first transistor T1, and transmits a voltage applied to the gate electrode of the first transistor T1 to the second storage electrode of the first capacitor Cst, and stores the voltage in the first capacitor Cst.

The fourth transistor T4 may have an N-type transistor characteristic, and may include an oxide semiconductor. The fourth transistor T4 initializes the gate electrode of the first transistor T1 and the second storage electrode of the first capacitor Cst. A gate electrode of the fourth transistor T4 is connected to the initialization control line 153, and a first electrode of the fourth transistor T4 is connected to the first initialization voltage line 127.

A second electrode of the fourth transistor T4 is connected to the second storage electrode of the first capacitor Cst, to the gate electrode of the first transistor T1, and to the second boost electrode of the first transistor T1 via the second electrode of the third transistor T3. A fourth transistor T4 is turned on according to the initialization control signal GI received through the initialization control line 153, and in this case, the first initialization voltage VINT is transmitted to the gate electrode of the first transistor T1 and the second storage electrode of the first capacitor Cst. Accordingly, the voltage of the gate electrode of the first transistor T1 and the first capacitor Cst may be initialized.

A fifth transistor T5 may have a P-type transistor characteristic, and may include a polycrystalline semiconductor. The fifth transistor T5 serves to transmit the driving voltage ELVDD to the first transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the first transistor T1.

A sixth transistor T6 may have a P-type transistor characteristic and may include a polycrystalline semiconductor. The sixth transistor T6 serves to transmit the driving current output from the first transistor T1 to the light emitting diode LED. A gate electrode of the sixth transistor T6 is connected to the light emission control line 155, a first electrode of the sixth transistor T6 is connected to the second electrode of the first transistor T1, and a second electrode of the sixth transistor T6 is connected to the anode of the light emitting diode LED.

The second scan line 152, together with the first electrode of the sixth transistor T6, may form a parasitic capacitor C1.

A seventh transistor T7 may have a P-type transistor characteristic and may include a polycrystalline semiconductor. The seventh transistor T7 serves to initialize the anode of the light emitting diode LED. A gate electrode of seventh transistor T7 is connected to the bypass control line 154, a first electrode of seventh transistor T7 is connected to the anode of light emitting diode LED, and a second electrode of seventh transistor T7 is connected to second initialization voltage line 128. When the seventh transistor T7 is turned on according to the bypass signal GB, the second initialization voltage VAINT is applied to the anode of the light emitting diode LED for initialization.

Although it is described above that one pixel PX includes seven transistors T1 to T7, one first capacitor Cst, and one second capacitor Cbt, the present disclosure is not limited thereto, and the number of transistors and capacitors, and their connection relationship, may be variously changed.

According to one or more embodiments, the first transistor T1 may include a polycrystalline semiconductor, and the third transistor T3 and the fourth transistor T4 may include an oxide semiconductor. The second transistor T2, the fifth transistor T5, the sixth transistor T6, and the seventh transistor T7 may include a polycrystalline semiconductor. However, the present disclosure is not limited thereto, and at least one of the second transistor T2, the fifth transistor T5, the sixth transistor T6, and the seventh transistor T7 may include an oxide semiconductor. The third transistor T3 and the fourth transistor T4 may be driven more stably and reliability may be improved by including semiconductor materials that are different from those of the first transistor T1.

When the second scan signal GC applied to the second scan line 152 is formed of an inverted signal of the first scan signal GW applied to the first scan line 151, the gate voltage of the first transistor T1 decreases after the data voltage DATA is input, and conversely, the first scan signal GW increases the gate voltage of the first transistor T1. Therefore, when a black voltage is written, the black voltage may decrease. Because the second capacitor Cbt is formed between the first scan line 151 and the gate electrode of the first transistor T1, the gate voltage of the first transistor T1 is adjusted to turn on the first transistor T1 when the second transistor T2 is turned on smoothly such that the data voltage DATA may be properly transmitted to the third transistor T3. Therefore, the black voltage may be output stably.

Referring to FIG. 2 to FIG. 12, together with FIG. 1, planar and cross-section structures of the display device according to one or more embodiments will be described.

Figure 2:
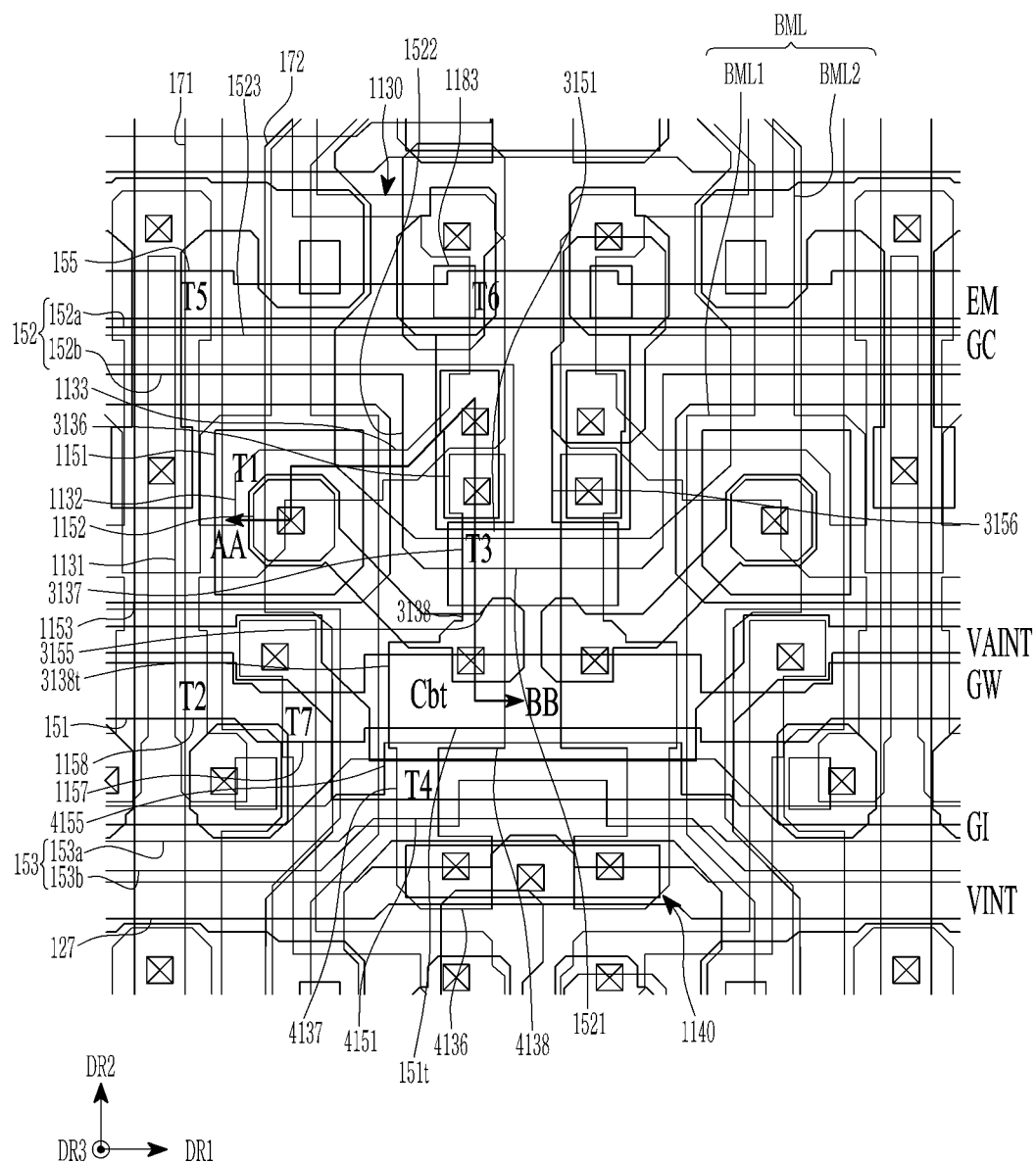
FIG. 2 is a top plan view of the display device according to one or more embodiments.
Figure 3:
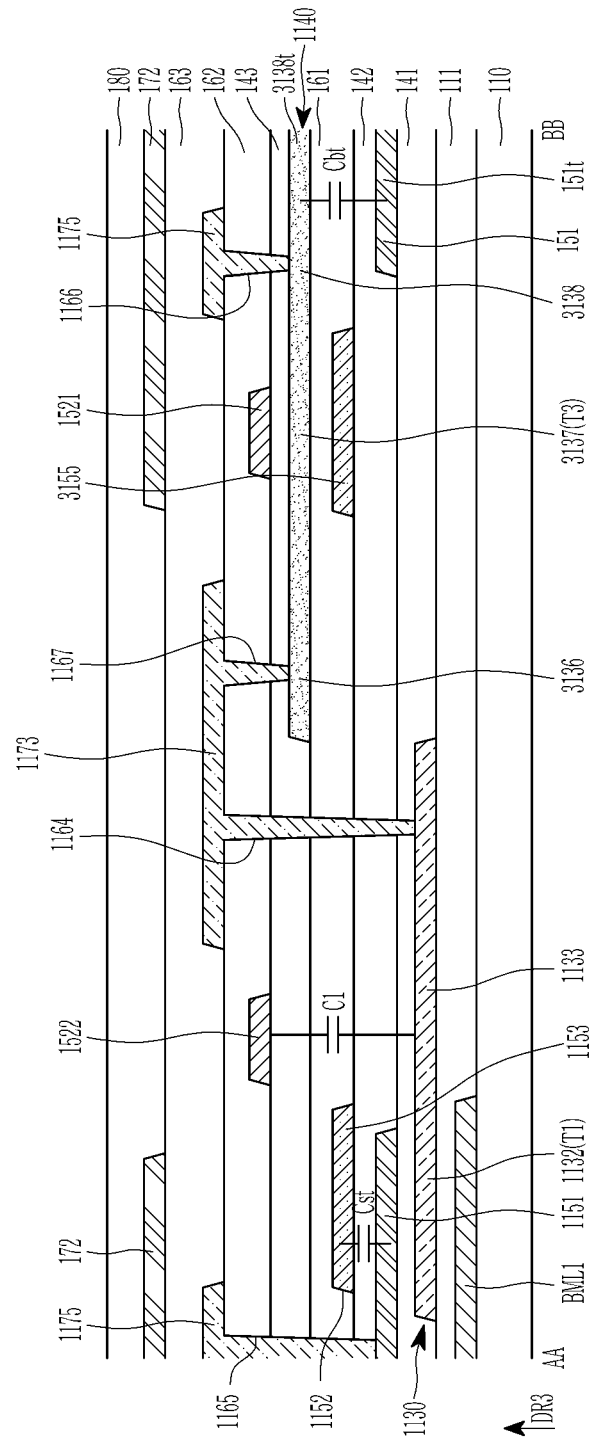
FIG. 3 is a cross-sectional view of the display device shown in FIG. 2, taken along the line AA-BB.

FIG. 2 is a top plan view of the display device according one or more embodiments, FIG. 3 is a cross-sectional view of the display device shown in FIG. 2, taken along the line AA-BB, and FIG. 4 to FIG. 12 are top plan views that sequentially illustrate the display device according to one or more embodiments in the stack order. In FIG. 4 to FIG. 12, a newly added layer is illustrated in gray.

FIG. 2 and FIG. 4 to FIG. 12 illustrate two pixels that are adjacent to each other on a plane, and the two pixels may have plane shapes that are symmetrical to each other in the first direction DR1. These two pixels may be repeatedly located in the first direction DR1 and the second direction DR2. However, the present disclosure is not limited thereto, and the two pixels may have some asymmetric shape. Hereinafter, the structure of the pixel positioned on the left will be mainly described. In addition, in the case of the seventh transistor T7, because it is connected to the first scan line 151 at the previous stage, the illustration is omitted, and the seventh transistor T7 at the next stage is shown instead.

Figure 4:
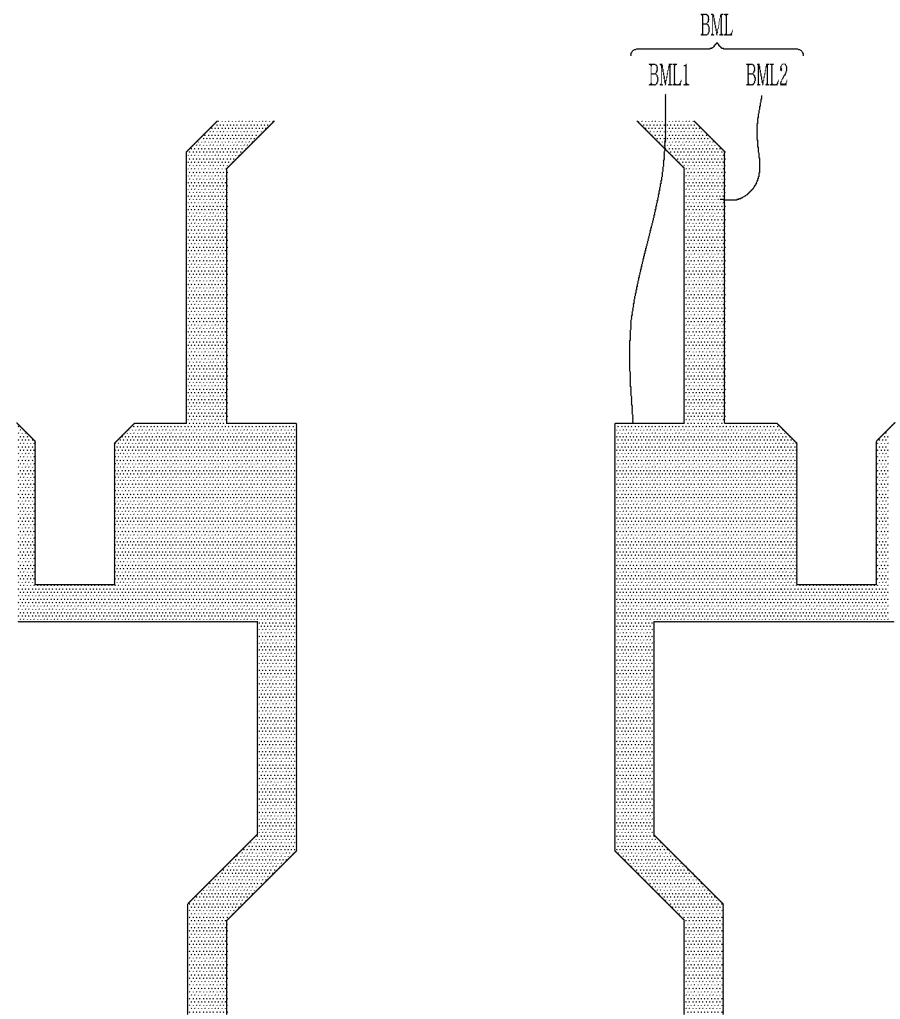
FIG. 4 to FIG. 12 are top plan views that sequentially illustrate the display device according to one or more embodiments in the stack order.

Referring to FIG. 2, FIG. 3, and FIG. 4, a blocking layer BML may be positioned on a substrate 110. The substrate 110 may include a material that does not bend due to a rigid characteristic, such as glass, or a flexible material that may be bent, such as plastic or polyimide. The blocking layer BML may include a plurality of expansion portions BML1, and a connection portion BML2 connecting the plurality of expansion portions BML1 to each other. The expansion portion BML1 of the blocking layer BML may be formed at a position overlapping on a plane with a channel 1132 of the first transistor T1 to be described later.

The blocking layer BML is also called a lower shielding layer, and may include a metal, such as copper (Cu), molybdenum (Mo), aluminum (Al), titanium (Ti), or a metal alloy. According to one or more other embodiments, the blocking layer BML may include amorphous silicon, and may be formed of a single layer or multiple layers.

Referring to FIG. 3, a buffer layer 111 may be positioned on the substrate 110 and the blocking layer BML. The buffer layer 111 may include an inorganic insulating material, such as a silicon oxide ($SiO_x$), a silicon nitride ($SiN_x$), or a silicon oxynitride ($SiO_xN_y$) or an organic insulating material.

Figure 5:
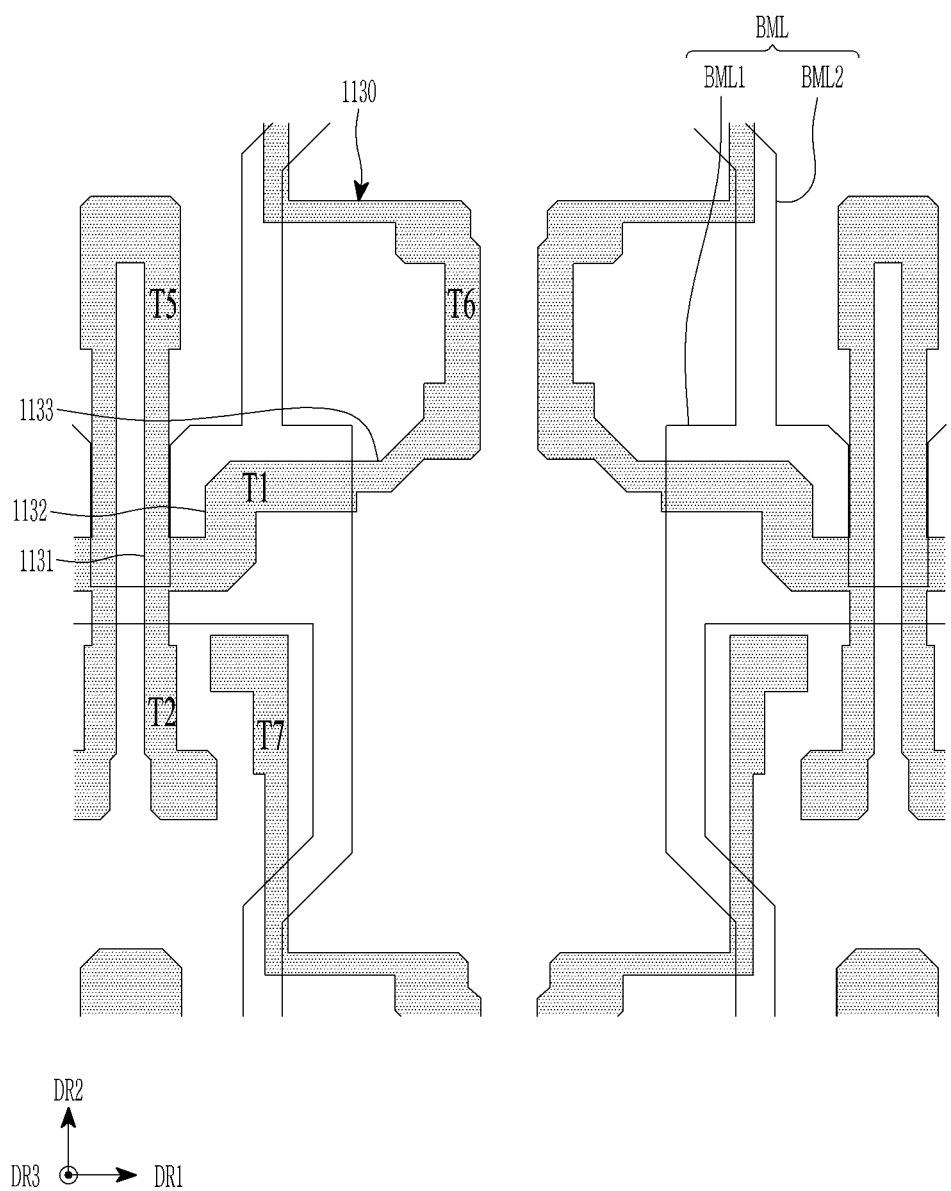

Referring to FIG. 2, FIG. 3, and FIG. 5, a first semiconductor layer 1130 that includes a channel 1132, a first electrode 1131, and a second electrode 1133 of the first transistor T1 may be positioned on the buffer layer 111. The first semiconductor layer 1130 may include, for example, a polycrystalline semiconductor material. The first semiconductor layer 1130 may further include a channel, a first electrode, and a second electrode, of each of the second transistor T2, the fifth transistor T5, the sixth transistor T6, and the seventh transistor T7.

The first semiconductor layer 1130 may be continuously formed along the first transistor T1, the second transistor T2, the fifth transistor T5, the sixth transistor T6, and the seventh transistor T7, and may include a curved portion.

The channel 1132 of the first transistor T1 may have a curved shape on a plane, but is not limited thereto and may be variously changed. The first electrode 1131 and the second electrode 1133 of the first transistor T1 may be positioned on both sides of the channel 1132 of the first transistor T1. The left portion of the first electrode 1131 of the first transistor T1 extends in the second direction DR2 on a plane, a portion extending downward may be connected to the second electrode of the second transistor T2, and a portion extending upward may be connected to the second electrode of the fifth transistor T5. The second electrode 1133 of the first transistor T1 may extend upward on a plane and may be connected to the first electrode of the sixth transistor T6.

Referring to FIG. 3, a first gate insulation layer 141 may be positioned on the first semiconductor layer 1130. The first gate insulation layer 141 may have a single-layer or multi-layer structure. The first gate insulation layer 141 may include an organic insulating material, such as a silicon oxide ($SiO_x$), a silicon nitride ($SiN_x$), or a silicon oxynitride ($SiO_xN_y$).

Figure 6:
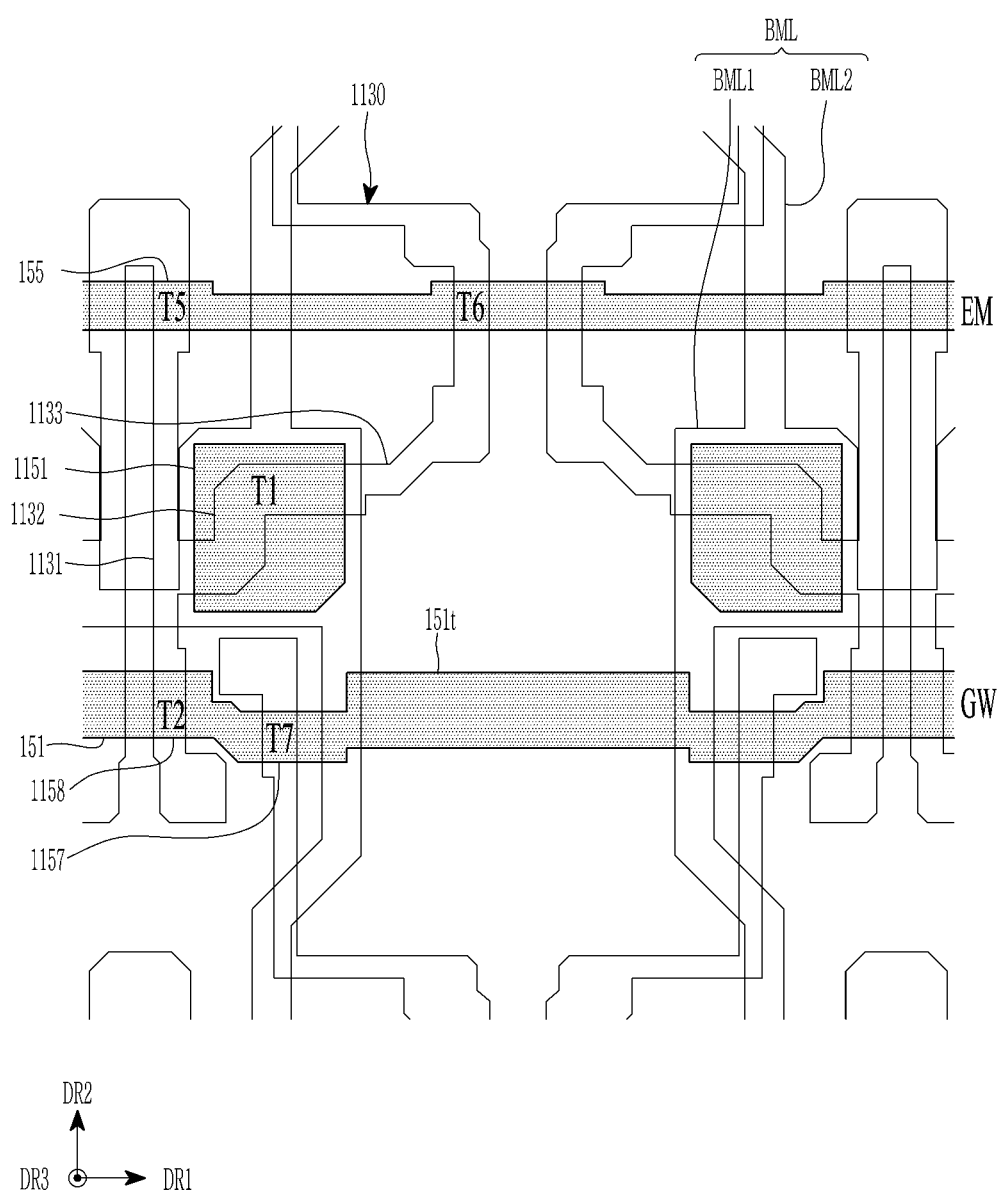

Referring to FIG. 2, FIG. 3, and FIG. 6, a first gate conductive layer including the gate electrode 1151 of the first transistor T1 may be positioned on the first gate insulation layer 141. The first gate conductive layer may have a single-layer or multi-layer structure. The first gate conductive layer may include a metallic material, such as molybdenum (Mo), aluminum (Al), copper (Cu), and/or titanium (Ti). The first gate conductive layer may further include gate electrodes of each of the second transistor T2, the fifth transistor T5, the sixth transistor T6, and the seventh transistor T7.

The gate electrode 1151 of the first transistor T1 may overlap with the channel 1132 of the first transistor T1. The channel 1132 of the first transistor T1 is covered by the gate electrode 1151 of the first transistor T1.

The first gate conductive layer may further include a first scan line 151 and a light emission control line 155. The first scan line 151 and the light emission control line 155 may extend substantially in the first direction DR1. The first scan line 151 may be connected to the gate electrode 1158 of the second transistor T2, and may be formed integrally with a gate electrode 1158 of the second transistor T2. The first scan line 151 may be connected to a gate electrode 1157 of a seventh transistor T7 positioned in a pixel of the next stage, and may be formed integrally with a gate electrode 1157 of the seventh transistor T7. A bypass control line connected to the seventh transistor T7 may be a lower first scan line 151 of the previous stage. A gate electrode of the fifth transistor T5 and a gate electrode of the sixth transistor T6 may be connected to a light emission control line 155, and may be formed integrally with the light emission control line 155.

The first scan line 151 may further include a first boost electrode 151t, which may be formed integrally with the first scan line 151. A width of the first boost electrode 151t in the second direction DR2 may be greater than a width of the gate electrode 1157 in the second direction DR2 of the seventh transistor T7. However, the present disclosure is not limited thereto, and the width of the first boost electrode 151t in second direction DR2 may be less than or equal to the width of the gate electrode 1157 of the seventh transistor T7 or the width of the gate electrode 1158 of the second transistor T2 in the second direction DR2.

The gate electrode 1151 of the first transistor T1 may be positioned between the first scan line 151 and the light emission control line 155 for one pixel, and may have an island shape.

After forming the first gate conductive layer, a doping process for the first semiconductor layer 1130 may be performed. A portion of the first semiconductor layer 1130 covered by the first gate conductive layer is not doped, and a portion of the first semiconductor layer 1130 not covered by the first gate conductive layer is doped, and may have the same characteristic as the conductor. In this case, a doping process may be performed with a P-type dopant, and the first transistor T1, the second transistor T2, the fifth transistor T5, the sixth transistor T6, and the seventh transistor T7 including the first semiconductor layer 1130 may have a P-type transistor characteristic.

Referring to FIG. 3, a second gate insulation layer 142 may be positioned on the first gate conductive layer and the first gate insulation layer 141. The second gate insulation layer 142 may have a single-layer or multi-layer structure. The second gate insulation layer 142 may include an organic insulating material, such as a silicon oxide ($SiO_x$), a silicon nitride ($SiN_x$), or a silicon oxynitride ($SiO_xN_y$).

Figure 7:
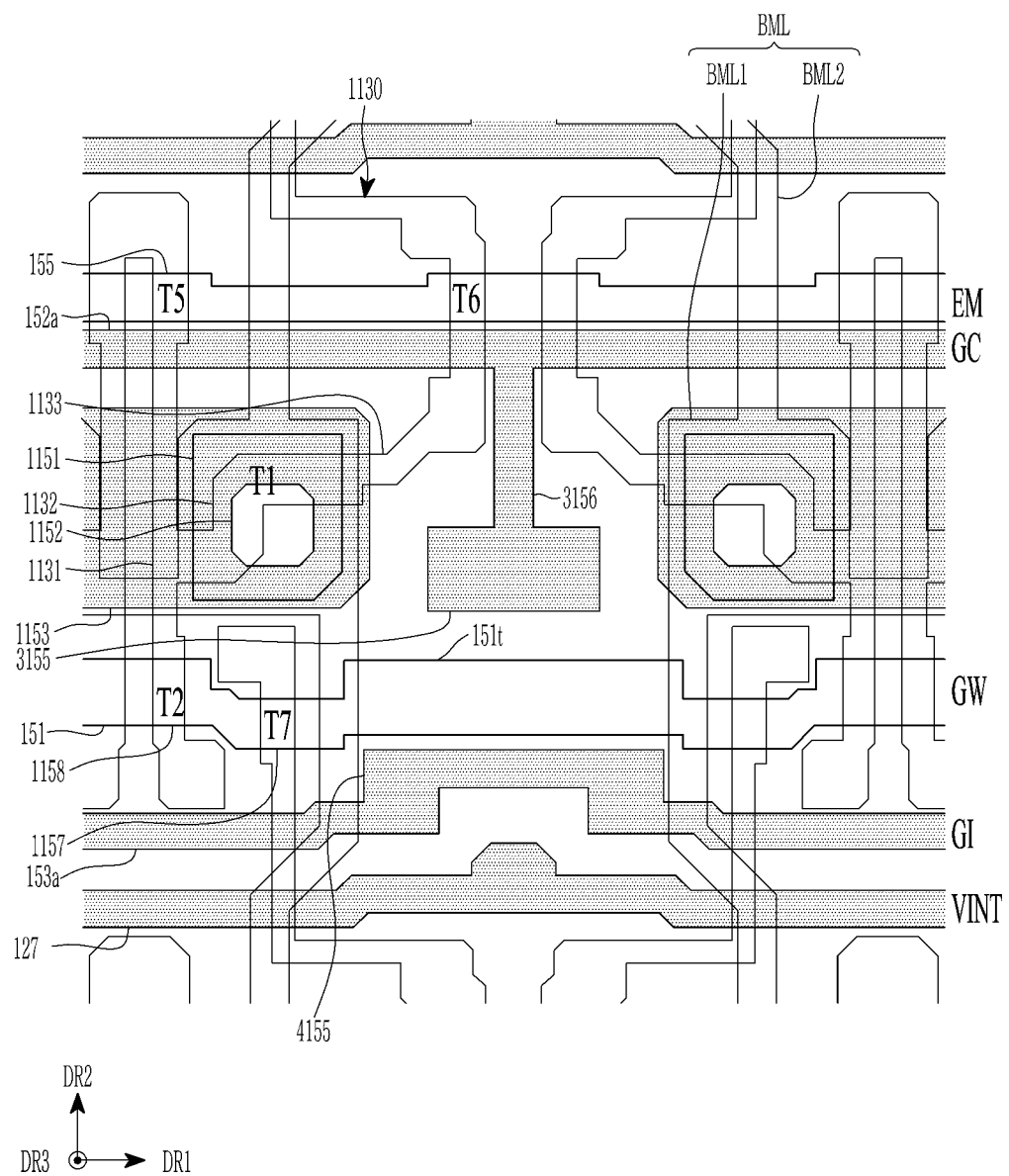
Figure 8:
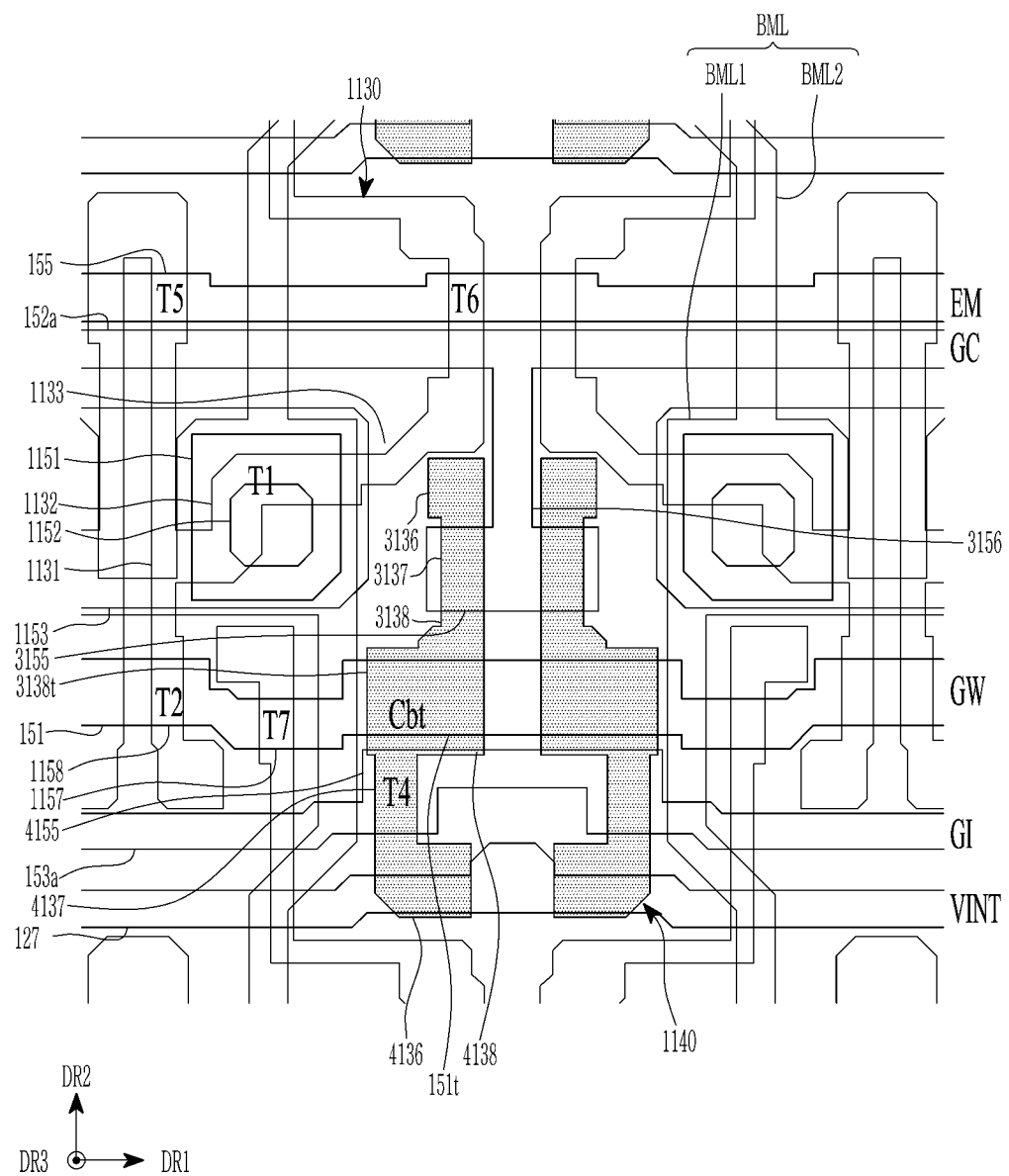

Referring to FIG. 2, FIG. 3, and FIG. 7, a second gate conductive layer including the first storage electrode 1153 of the first capacitor Cst, a light blocking layer 3155 of the third transistor T3, and a light blocking layer 4155 of the fourth transistor T4 may be positioned on the second gate insulation layer 142. The second gate conductive layer may have a single-layer or multi-layer structure. The second gate conductive layer may include a metallic material, such as molybdenum (Mo), aluminum (Al), copper (Cu), and/or titanium (Ti).

The first storage electrode 1153 overlaps the gate electrode 1151 of the first transistor T1 with the second gate insulation layer 142 interposed therebetween to form the first capacitor Cst. An opening 1152 is formed in the first storage electrode 1153 of the first capacitor Cst. The opening 1152 may overlap the gate electrode 1151 of the first transistor T1. As shown in FIG. 2 and FIG. 3, the light blocking layer 3155 of the third transistor T3 may overlap with a channel 3137 and a gate electrode 3151 of the third transistor T3. The light blocking layer 4155 of the fourth transistor T4 may overlap with a channel 4137 and a gate electrode 4151 of the fourth transistor T4, which will be described later.

The driving voltage ELVDD may be transmitted to the first storage electrode 1153.

The second gate conductive layer may further include a lower second scan line 152a, a lower initialization control line 153a, and a first initialization voltage line 127. The lower second scan line 152a, the lower initialization control line 153a, and the first initialization voltage line 127 may extend substantially in the first direction DR1. The lower second scan line 152a may be connected to the light blocking layer 3155 through a connection portion 3156, and may be formed integrally with the light blocking layer 3155 and the connection portion 3156. The lower initialization control line 153a may be connected to the light blocking layer 4155, and may be formed integrally with the light blocking layer 4155.

Depending on embodiments, at least one of the lower second scan line 152a and the lower initialization control line 153a may be omitted.

Referring to FIG. 3, a first interlayer insulation layer 161 may be positioned on the second gate conductive layer. The first interlayer insulation layer 161 may have a single-layer or multi-layer structure. The first interlayer insulation layer 161 may include an inorganic insulating material, such as a silicon oxide ($SiO_x$), a silicon nitride ($SiN_x$), or a silicon oxynitride ($SiO_xN_y$).

Referring to FIG. 2 and FIG. 3 to FIG. 8, a second semiconductor layer 1140 that includes the channel 3137, the first electrode 3136, and the second electrode 3138 of the third transistor T3, and the channel 4137, the first electrode 4136, and the second electrode 4138 of the fourth transistor T4 may be positioned on the first interlayer insulation layer 161. The second semiconductor layer 1140 may include, for example, an oxide semiconductor material.

The second semiconductor layer 1140 may include at least one of a primary metal oxide, such as an indium oxide (In), a tin oxide (Sn), or a zinc oxide (Zn): a binary metal oxide, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide, such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn oxide, an In—Tm—Zn-based oxide, an In—Yb—Zn-based oxide, or an In—Lu—Zn-based oxide, and a quaternary metal oxide, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor layer may include an indium-gallium-zinc oxide (IGZO) among the in-Ga—Zn-based oxides.

The channel 3137, the first electrode 3136, and the second electrode 3138 of the third transistor T3, and the channel 4137, the first electrode 4136, and the second electrode 4138 of the fourth transistor T4, may be respectively connected to each other and formed integrally. The first electrode 3136 and the second electrode 3138 of the third transistor T3 may be positioned on respective sides of the channel 3137 of the third transistor T3. The first electrode 4136 and the second electrode 4138 of the fourth transistor T4 may be positioned on respective sides of the channel 4137 of the fourth transistor T4. The second electrode 3138 of the third transistor T3 may be connected to the second electrode 4138 of the fourth transistor T4. The channel 3137 of the third transistor T3 may overlap the light blocking layer 3155. The channel 4137 of the fourth transistor T4 may overlap the light blocking layer 4155.

The second semiconductor layer 1140 may further include a second boost electrode 3138t that is a part of the conductive region. The second boost electrode 3138t may be connected to the second electrode 3138 of the third transistor T3, and may be formed integrally with the second electrode 3138 of the third transistor T3. The second boost electrode 3138t may be connected to the second electrode 4138 of the fourth transistor T4. The second boost electrode 3138t may be integrally formed with the second electrode 4138 of the fourth transistor T4. The second boost electrode 3138t may overlap the first boost electrode 151t with the second gate insulation layer 142 and the first interlayer insulation layer 161 interposed therebetween. That is, the first scan line 151 may intersect and may overlap the second semiconductor layer 1140.

According to one or more embodiments, a width of the second boost electrode 3138t in the first direction DR1 may be greater than a width of at least one of the channel 3137 of the third transistor T3 and the channel 4137 of the fourth transistor T4 in the first direction DR1.

Referring to FIG. 3, a third gate insulation layer 143 may be positioned on the second semiconductor layer 1140. The third gate insulation layer 143 may cover upper surfaces and side surfaces of the channel 3137, the first electrode 3136, and the second electrode 3138 of the third transistor T3, and may cover the channel 4137, the first electrode 4136, and the second electrode 4138 of the fourth transistor T4. The third gate insulation layer 143 may be formed on the entire surface of the substrate 110, and may overlap the channel 3137 of the third transistor T3 and the channel 4137 of the fourth transistor T4, but may not overlap the rest. The third gate insulation layer 143 may have a single-layer or multi-layer structure. The third gate insulation layer 143 may include an inorganic insulating material, such as a silicon oxide ($SiO_x$), a silicon nitride ($SiN_x$), or a silicon oxynitride ($SiO_xN_y$).

Referring to FIG. 2 and FIG. 3 to FIG. 9, a third gate conductive layer including the gate electrode 3151 of the third transistor T3 and the gate electrode 4151 of the fourth transistor T4 may be positioned on the third gate insulation layer 143. The third gate conductive layer may have a single-layer or multi-layer structure. The third gate conductive layer may include a metallic material, such as molybdenum (Mo), aluminum (Al), copper (C), and/or titanium (Ti).

The gate electrode 3151 of the third transistor T3 may overlap with the channel 3137 of the third transistor T3. The gate electrode 4151 of the fourth transistor T4 may overlap the channel 4137 of the fourth transistor T4. The gate electrode 4151 of the fourth transistor T4 may overlap the light blocking layer 4155.

The third gate conductive layer may further include an upper second scan line 152b and an upper initialization control line 153b.

The upper second scan line 152b forms the second scan line 152 together with the lower second scan line 152a. The same signal may be applied to the upper second scan line 152b and the lower second scan line 152a. The upper second scan line 152b and the lower second scan line 152a may be electrically connected to each other. The upper second scan line 152b and the lower second scan line 152a may be electrically connected to each other outside the display area or electrically connected to each other inside the display area. The upper second scan line 152b may be connected to the gate electrode 3151 of the third transistor T3, and may be formed integrally with the gate electrode 3151 of the third transistor T3. That is, the upper second scan line 152b may include the gate electrode 3151 of the third transistor T3.

Figure 9:
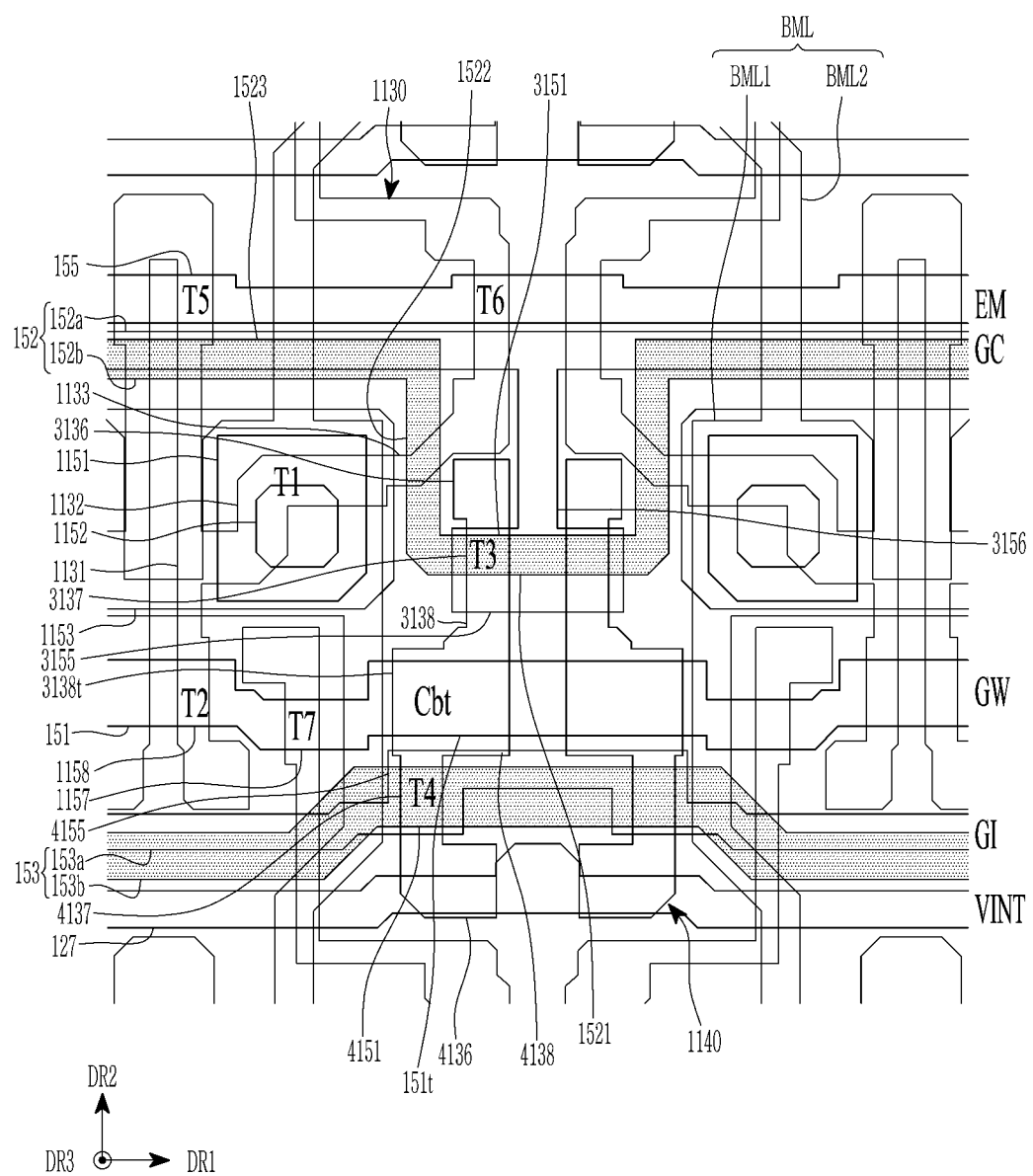

In the display area or a region of the pixel PX, the upper second scan line 152b may have a substantially different planar shape from the lower second scan line 152a. Referring to FIG. 2 and FIG. 9, the upper second scan line 152b may be periodically curved. For example, the upper second scan line 152b may include a first portion 1521 extending substantially in the first direction DR1, a second portion 1522 bent from the first portion 1521 and extending substantially in the second direction DR2, and a third portion 1523 bent from the second portion 1522 and extending substantially in the first direction DR1.

The first portion 1521 may overlap the light blocking layer 3155 of the lower second scan line 152a, and may overlap the light blocking layer 3155 while crossing the light blocking layer 3155 in the first direction DR1. A width of the light blocking layer 3155 in the second direction DR2 may be greater than a width of the first portion 1521 in the second direction DR2. The first portion 1521 of the upper second scan line 152b overlapping the second semiconductor layer 1140 may form the gate electrode 3151 of the third transistor T3. That is, the first portion 1521 may include a gate electrode 3151 overlapping the channel 3137 of the third transistor T3. One end of the first portion 1521 may be adjacent to the first storage electrode 1153 of the first capacitor Cst and the gate electrode 1151 of the first transistor T1 in the first direction DR1.

An imaginary extension line of the first portion 1521 in the first direction DR1 may pass through the first storage electrode 1153 of the first capacitor Cst on a plane. The virtual extension line of the first portion 1521 in the first direction DR1 may cross through the connection electrode 1175 of the first data conductive layer, which will be described later. On the other hand, imaginary extension lines of the second portion 1522 and the third portion 1523 may not pass through the first storage electrode 1153. The imaginary extension line of the third portion 1523 may not pass the connection electrode 1175.

The third portion 1523 overlaps the lower second scan line 152a and may extend in parallel thereto. The third portion 1523 may be adjacent to the first storage electrode 1153 of the first capacitor Cst and the gate electrode 1151 of the first transistor T1 in the second direction DR2. The third portion 1523 may include a portion extending substantially parallel to, and adjacent to one side extending in the first direction DR1 of, the first storage electrode 1153.

The second portion 1522 may connect one end of the first portion 1521 to one end of the third portion 1523 facing the end of the first portion 1521 in the second direction DR2. The second portion 1522 may extend in the second direction DR2 between (e.g., in plan view) the first storage electrode 1153 of the first capacitor Cst and the gate electrode 1151 of the first transistor T1 and openings 1164 and 1167 of the second interlayer insulation layer 162 and third gate insulation layer 143, which are described later. In addition, the second portion 1522 may extend in the second direction DR2 between the first storage electrode 1153 of the first capacitor Cst and the gate electrode 1151 of the first transistor T1 and the connection electrode 1173 of the first data conductive layer, which are described later. In addition, the second portion 1522 connects between the lower second scan line 152a and the light blocking layer 3155, and may extend in the second direction DR2 between the connection portion 3156, which substantially extends in the second direction DR2, and the first storage electrode 1153 of the first capacitor Cst. The second portion 1522 may extend substantially in parallel to the connection portion 3156 of the lower second scan line 152a.

The second portion 1522 may be adjacent to the first storage electrode 1153 of the first capacitor Cst and the gate electrode 1151 of the first transistor T1 in the first direction DR1. The second portion 1522 may include a portion extending substantially parallel to and adjacent to one side extending in the second direction DR2 of the first storage electrode 1153. That is, the upper second scan line 152b may include a first portion 1521 and a second portion 1522 extending along two sides extending in different directions of the first capacitor Cst or the first storage electrode 1153, and a bent portion therebetween.

The second portion 1522 may overlap a portion of the second electrode 1133 of the first transistor T1 among the first semiconductor layer 1130, while crossing the same on a plane. That is, the second portion 1522 may overlap the conductive region of the first semiconductor layer 1130. A third gate insulation layer 143, a first interlayer insulation layer 161, a second gate insulation layer 142, and a first gate insulation layer 141 may be positioned between the second portion 1522 and the second electrode 1133 of the first transistor T1 on the cross-section. Accordingly, the upper second scan line 152b may overlap both of the channel 3137 of the third transistor T3 of the second semiconductor layer 1140, and the first semiconductor layer 1130.

On a plane, the first storage electrode 1153 of the first capacitor Cst may be positioned between the upper second scan line 152b and the first scan line 151.

The upper initialization control line 153b may overlap the lower initialization control line 153a. The upper initialization control line 153b forms the initialization control line 153 together with the lower initialization control line 153a. The same signal may be applied to the upper initialization control line 153b and the lower initialization control line 153a. The upper initialization control line 153b and the lower initialization control line 153a may be electrically connected to each other. The upper initialization control line 153b and the lower initialization control line 153a may be electrically connected to each other outside the display area or electrically connected to each other inside the display area. The upper initialization control line 153b may be connected to the gate electrode 4151 of the fourth transistor T4, and may be formed integrally with the gate electrode 4151 of the fourth transistor T4. That is, the upper initialization control line 153b may include the gate electrode 4151 of the fourth transistor T4.

After forming the third gate conductive layer, the doping process for the second semiconductor layer 1140 may be performed. A portion of the second semiconductor layer 1140 covered by the third gate conductive layer is not doped, and a portion of the second semiconductor layer 1140 not covered by the third gate conductive layer is doped to have the same characteristic as the conductor. The channel 3137 of the third transistor T3 may be positioned under the gate electrode 3151 to overlap the gate electrode 3151. The first electrode 3136 and the second electrode 3138 of the third transistor T3 might not overlap the gate electrode 3151. The channel 4137 of the fourth transistor T4 may be positioned under the gate electrode 4151 to overlap the gate electrode 4151. The first electrode 4136 and the second electrode 4138 of the fourth transistor T4 may not overlap the gate electrode 4151. The second boost electrode 3138t might not overlap the third gate conductive layer. The doping process of the second semiconductor layer 1140 may be performed with an N-type dopant, and the third transistor T3 and the fourth transistor T4 including the second semiconductor layer 1140 may have an N-type transistor characteristic.

Referring to FIG. 3, a second interlayer insulation layer 162 may be positioned on the third gate conductive layer. The second interlayer insulation layer 162 may have a single-layer or multi-layer structure. The second interlayer insulation layer 162 may include an organic insulating material, such as a silicon oxide ($SiO_x$), a silicon nitride ($SiN_x$), or a silicon oxynitride ($SiO_xN_y$).

The second interlayer insulation layer 162 and the third gate insulation layer 143 may include, or define, a plurality of openings 1160, 1161, 1162, 1163, 1164, 1165, 1166, 1167, 1168, 1169, and 1170. The opening 1165 may overlap at least a part of the gate electrode 1151 of the first transistor T1 on a plane. The opening 1165 may be formed by extending to the first interlayer insulation layer 161 and the second gate insulation layer 142. The opening 1165 may overlap with the opening 1152 of the first storage electrode 1153 on a plane. On a plane, the opening 1165 may be positioned inside, or within, the opening 1152 of the first storage electrode 1153. The opening 1166 may at least partially overlap with the second capacitor Cbt on a plane. The opening 1164 may overlap at least a part of the second electrode 1133 of the first transistor T1 on a plane. The opening 1164 may be formed by extending to the first interlayer insulation layer 161, the second gate insulation layer 142, and the first gate insulation layer 141. The opening 1167 may overlap with at least a portion of the first electrode 3136 of the third transistor T3 on a plane.

Figure 10:
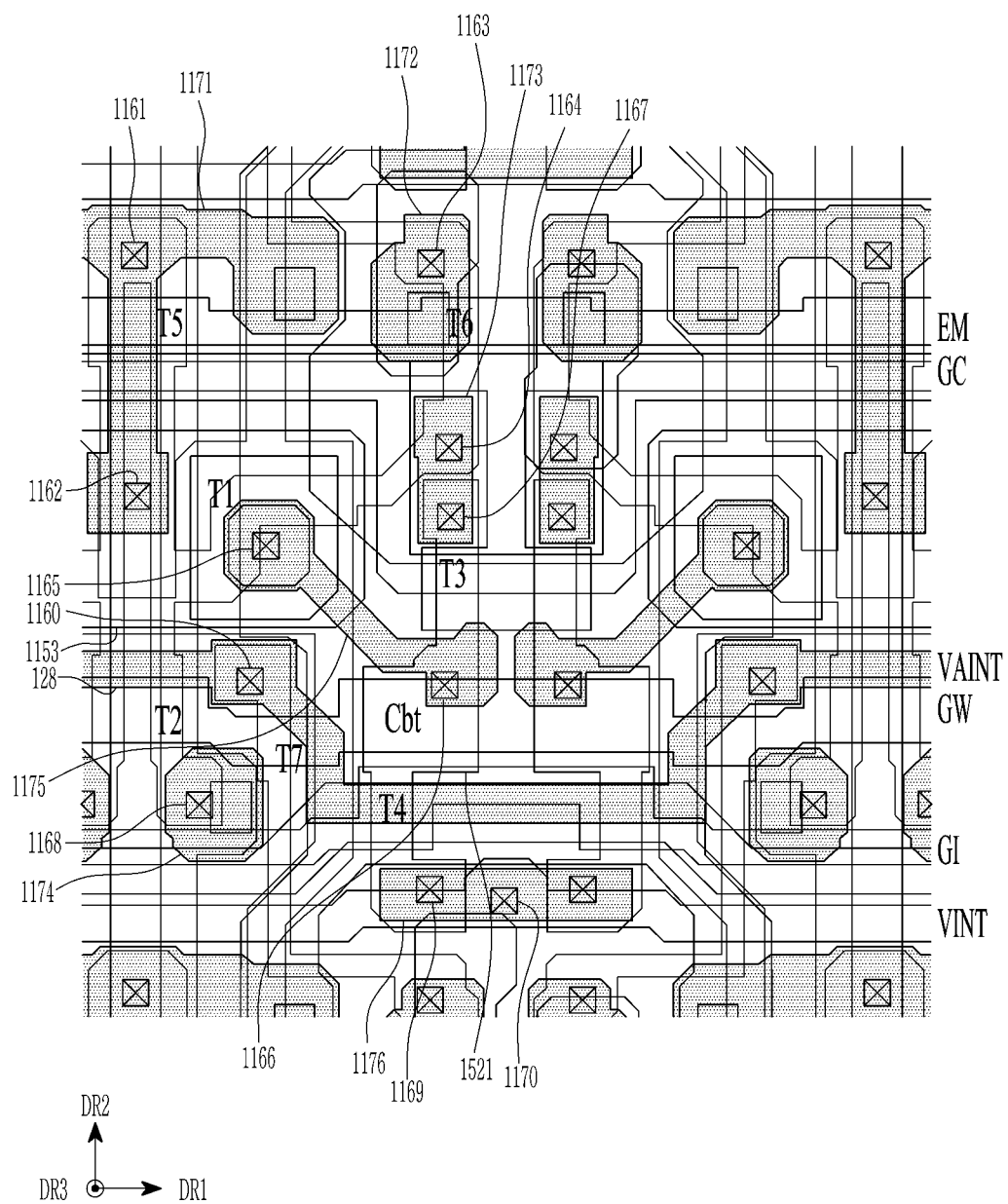

Referring to FIG. 2, FIG. 3, and FIG. 10, a first data conductive layer including a plurality of connection electrodes 1171, 1172, 1173, 1174, 1175, and 1176 may be positioned on the second interlayer insulation layer 162. The first data conductive layer may have a single-layer or multi-layer structure. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The connection electrode 1175 may overlap the gate electrode 1151 of the first transistor T1 on a plane. The connection electrode 1175 may be electrically connected to the gate electrode 1151 of the first transistor T1 through the opening 1165 and the opening 1152 of the first storage electrode 1153. The connection electrode 1175 may at least partially overlap the second capacitor Cbt. The connection electrode 1175 may be connected to the second boost electrode 3138t of the second capacitor Cbt through the opening 1166. Accordingly, the gate electrode 1151 of the first transistor T1 and the second boost electrode 3138t of the second capacitor Cbt may be connected to each other by the connection electrode 1175. The gate electrode 1151 of the first transistor T1 may also be electrically connected to the second electrode 3138 of the third transistor T3 and the second electrode 4138 of the fourth transistor T4 by the connection electrode 1175.

As shown in FIG. 2 and FIG. 10, the connection electrode 1175 may include a portion extending in a direction oblique to the first direction DR1 and the second direction DR2. The upper second scan line 152b of the third gate conductive layer described above may include a side parallel to an edge side of a portion extending in an oblique direction to the first direction DR1 and the second direction DR2 of the connection electrode 1175.

The connection electrode 1173 may overlap the second electrode 1133 of the first transistor T1. The connection electrode 1173 may be electrically connected to the second electrode 1133 of the first transistor T1 through the opening 1164. The connection electrode 1173 may overlap the first electrode 3136 of the third transistor T3. The connection electrode 1173 may be electrically connected to the first electrode 3136 of the third transistor T3 through the opening 1167. Accordingly, the second electrode 1133 of the first transistor T1 and the first electrode 3136 of the third transistor T3 may be electrically connected by the connection electrode 1173.

The connection electrode 1174 may be electrically connected to the first electrode of the second transistor T2 through the opening 1168. The connection electrode 1171 may be electrically connected to the first electrode of the fifth transistor T5 through the opening 1161, and may be electrically connected to the first storage electrode 1153 through the opening 1162. The connection electrode 1172 may be electrically connected to the second electrode of the sixth transistor T6 through the opening 1163.

The first data conductive layer may further include a second initialization voltage line 128. The second initialization voltage line 128 may extend in the first direction DR1 in general.

Referring to FIG. 3, the third interlayer insulation layer 163 may be positioned on the first data conductive layer. The third interlayer insulation layer 163 may have a single-layer or multi-layer structure. The third interlayer insulation layer 163 may include an organic insulating material, such as a general purpose polymer, such as poly(methylmethacrylate) (PMMA) or polystyrene (PS), a polymer derivative having a phenolic group, an acrylic polymer, an imide polymer, a polyimide, and a siloxane polymer, or an inorganic insulating material. The third interlayer insulation layer 163 may include a plurality of openings 1182, 1183, and 1181 respectively positioned on the connection electrodes 1171, 1172, and 1174.

Figure 11:
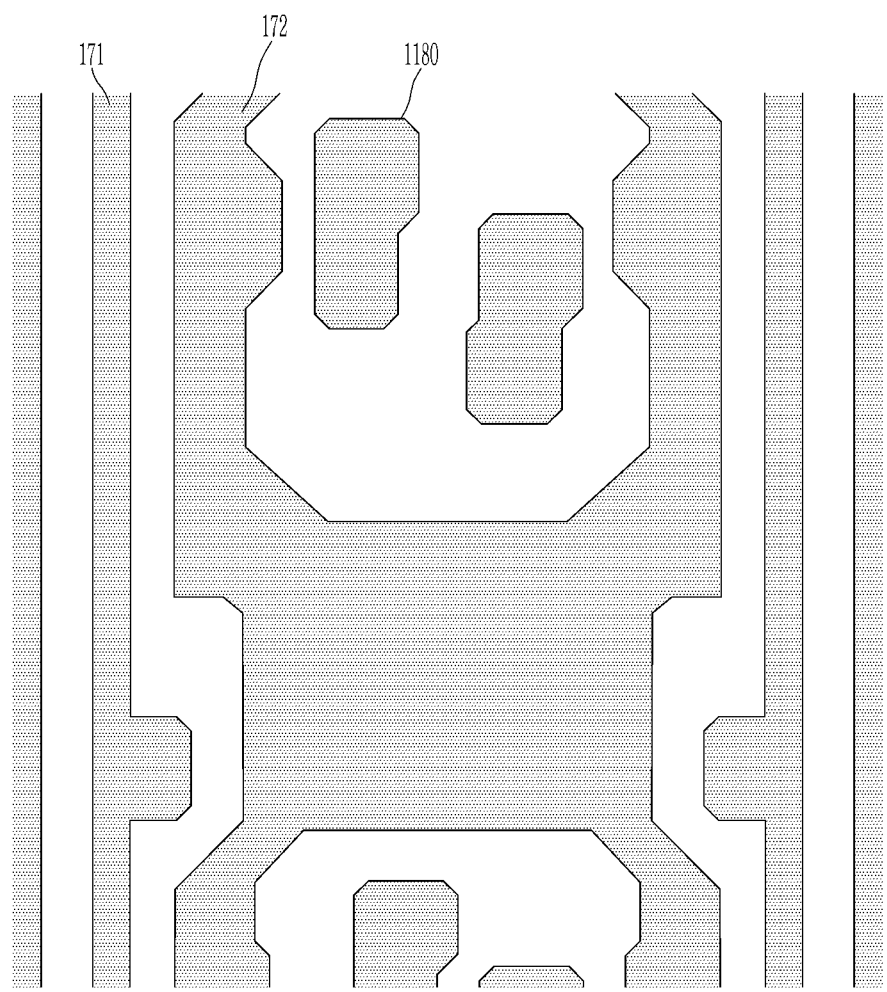
Figure 12:
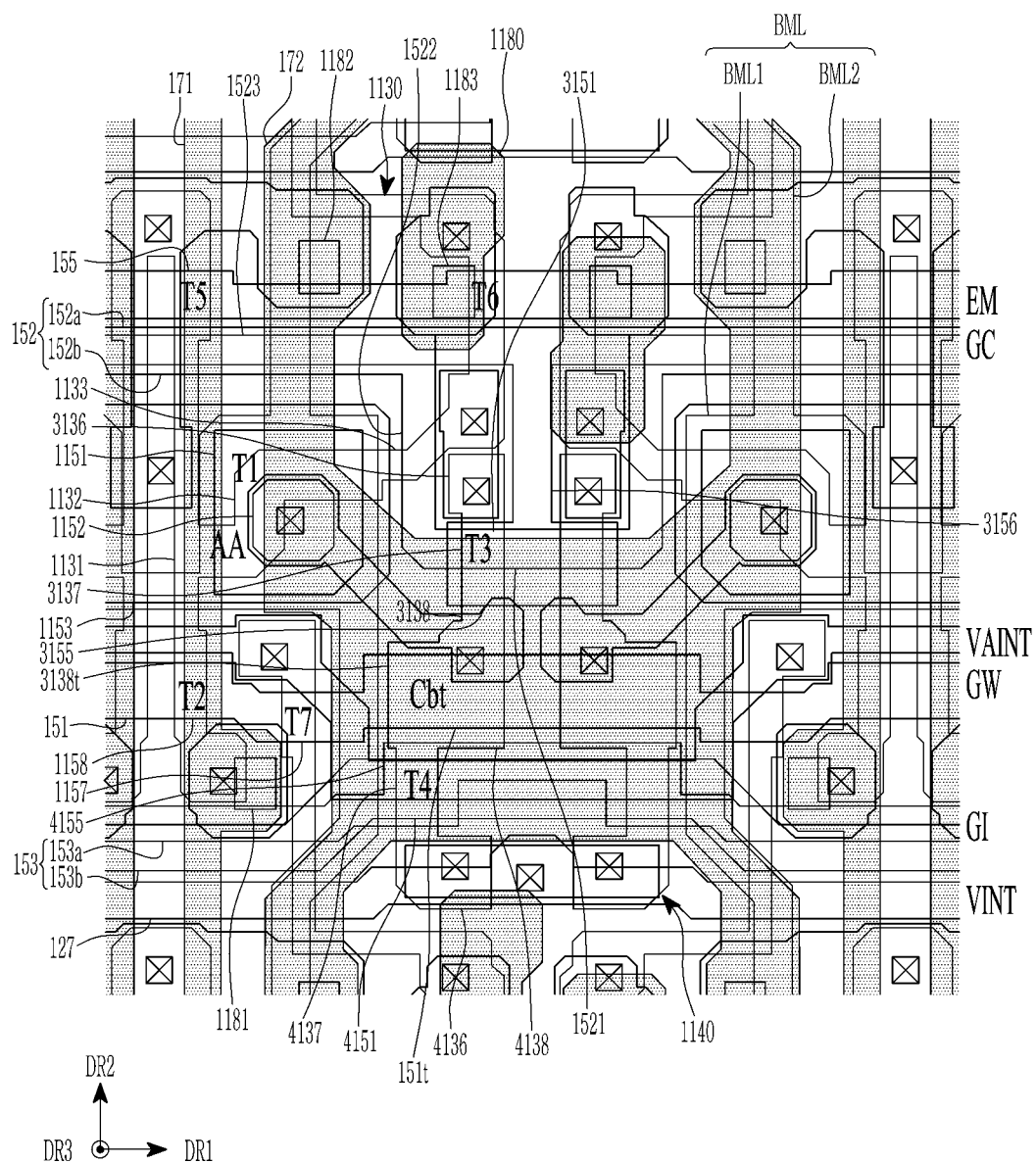

Referring to FIG. 2, FIG. 3, FIG. 11, and FIG. 12, a second data conductive layer including the data line 171 and the driving voltage line 172 may be positioned on the third interlayer insulation layer 163. FIG. 11 shows only the second data conductive layer separately for convenience of understanding. Referring to FIG. 11 and FIG. 12, the data line 171 and the driving voltage line 172 may extend substantially in the second direction DR2.

The data line 171 may be electrically connected to the lower connection electrode 1174 through the opening 1181 of the third interlayer insulation layer 163 such that the data line 171 may be electrically connected to the first electrode of the second transistor T2.

The driving voltage line 172 may be electrically connected to the lower connection electrode 1171 through the opening 1182 of the third interlayer insulation layer 163 such that the driving voltage line 172 may be electrically connected to the fifth transistor T5 and the first storage electrode 1153.

The second data conductive layer may further include a connection electrode 1180. The connection electrode 1180 may be electrically connected to the lower connection electrode 1172 through the opening 1183 of the third interlayer insulation layer 163, and thus may be electrically connected to the second electrode of the sixth transistor T6. The second data conductive layer may have a single-layer or multi-layer structure. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The protective layer 180 may be positioned on the data line 171 and the driving voltage line 172, and an anode may be positioned on a protective layer 180. The protective layer 180 may include an organic insulating material, such as a general purpose polymer, such as poly(methylmethacrylate) (PMMA) or polystyrene (PS), a polymer derivative having a phenolic group, an acrylic polymer, an imide polymer, a polyimide, and a siloxane polymer. The anode may be electrically connected to the sixth transistor T6, and may receive an output current of the first transistor T1. A partitioning wall may be positioned on the anode. An opening is formed in the partitioning wall, and the opening of the partitioning wall may overlap the anode. A layer of light emitting element layer may be positioned within the opening of the partitioning wall. A cathode may be positioned on the light emitting element layer and the partitioning wall. The anode, the light emitting element layer, and the cathode form the light emitting diode LED.

After the upper second scan line 152b of the third gate conductive layer overlaps with the channel 3137 of the third transistor T3, the upper second scan line 152b has a shape that is bent at least twice along edges of the first capacitor Cst without overlapping with the connection electrode 1175 of the first data conductive layer. That is, the upper second scan line 152b is spaced apart from the connection electrode 1175 on a plane. Accordingly, after the gate electrode 3151 overlapping with the channel 3137 of the third transistor T3 is formed, creation of a parasitic capacitor between the connection electrode 1175 and the second scan line 152b may be avoided when the upper second scan line 152b overlaps the connection electrode 1175 of the first data conductive layer without extending long in the second direction DR2. The parasitic capacitors are generated with the second interlayer insulation layer 162, which is only one insulation layer (e.g., with the second interlayer insulation layer 162 between the connection electrode 1175 and the second scan line 152b), and thus the capacitance may be significantly large and may significantly affect the voltage of the gate electrode of the first transistor T1, thereby preventing dispersion in the luminance of pixels, which may be caused due to the spread, or variation, that can occur in the parasitic capacitor in the manufacturing process. However, according to one or more embodiments, the generation of such a parasitic capacitor may be reduced or blocked, and thus the deviation in the luminance of the pixel may be reduced or prevented according to the distribution of the position and width of the connection electrode 1175 and the upper second scan line 152b.

In addition, there is no need to increase the capacitance of the second capacitor Cbt to compensate for the voltage change of the gate electrode of the first transistor T1 due to such a parasitic capacitor, and thus a planar area of the second capacitor Cbt may be designed to be relatively small. Accordingly, the degree of freedom of design of the pixel may be increased or the size of the pixel may be reduced such that the resolution of the display device may be further increased.

Next, referring to FIG. 13, a display device according to one or more embodiments will be described.

Figure 13:
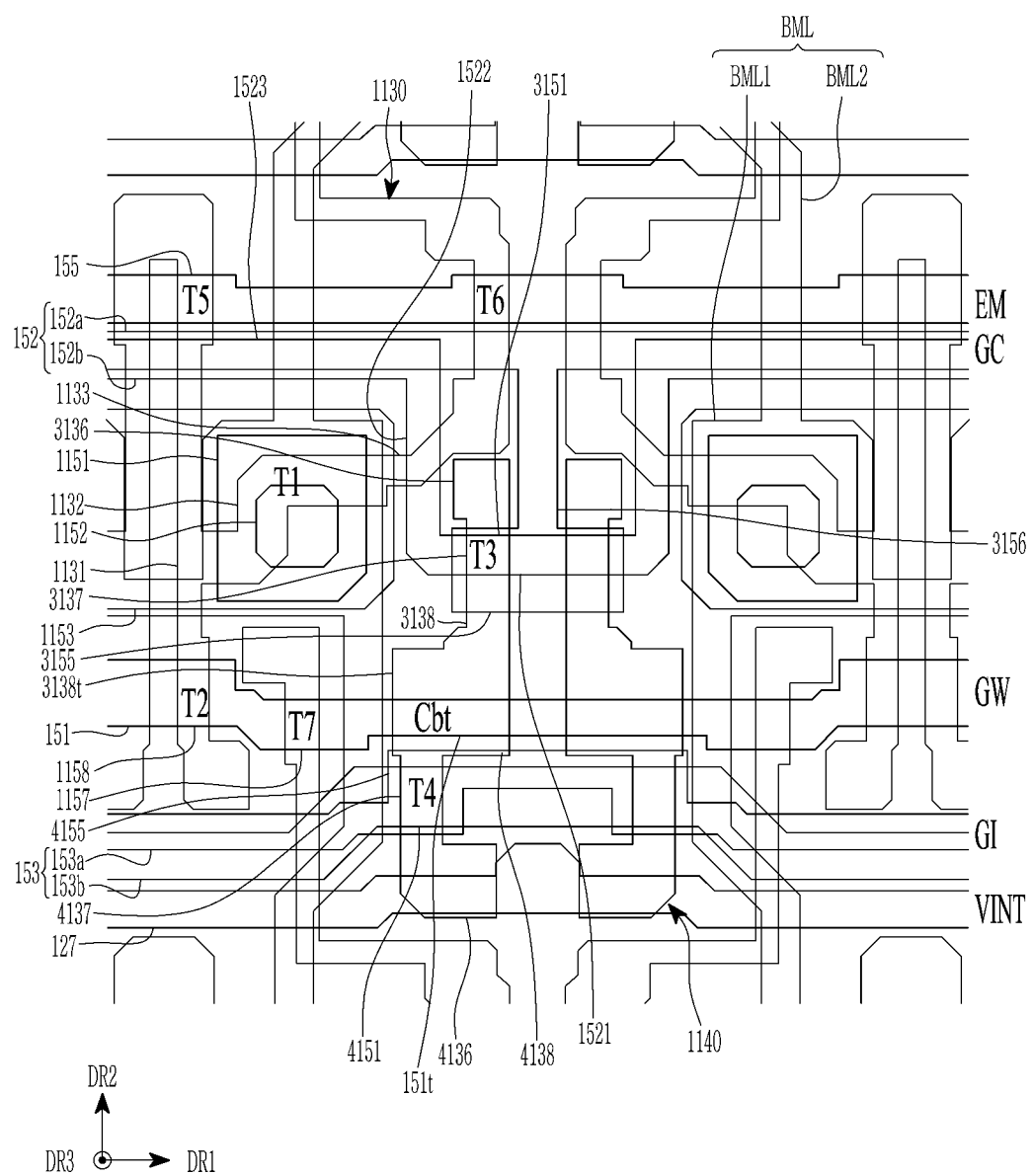
FIG. 13 and FIG. 14 are top plan views of display devices according to embodiments.

FIG. 13 is a top plan view of a display device according to one or more embodiments.

A display device according to one or more embodiments is almost the same as the display device according to one or more of the above-described embodiments, but a width of a first boost electrode 151t of a first scan line 151 is reduced in a second direction DR2 such that it may be smaller than or equal to a width of a gate electrode 1157 of a seventh transistor T7 or a gate electrode 1158 of a second transistor T2 first scan line 151 in the second direction DR2. Accordingly, the capacitance of the second capacitor Cbt may be further reduced, and dispersion in the luminance of the pixel due to the dispersion of the second capacitor Cbt may be reduced.

Next, referring to FIG. 14, a display device according to one or more embodiments will be described.

Figure 14:
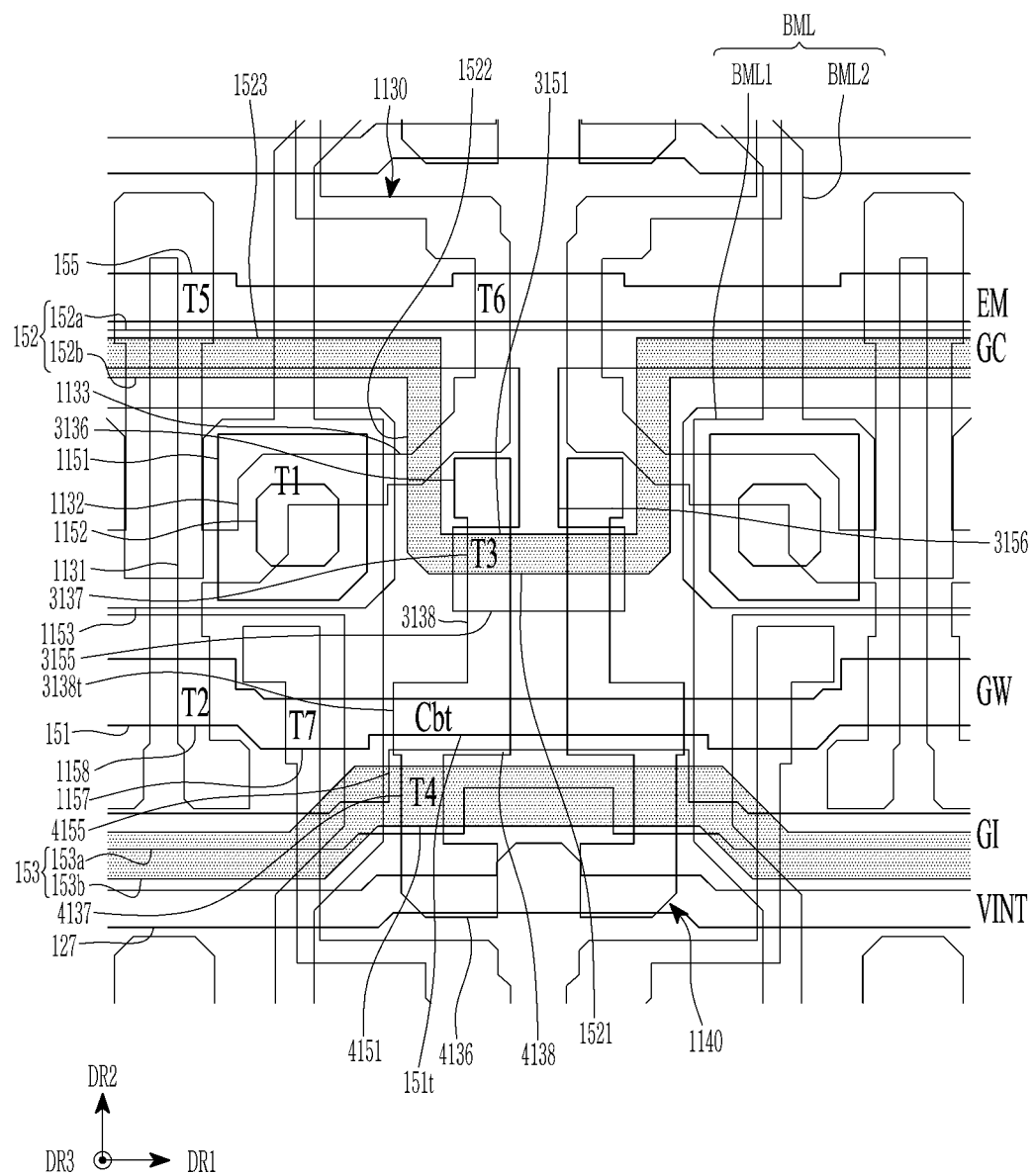

FIG. 14 is a top plan view of a display device according to one or more embodiments.

A display device according to one or more embodiments is almost the same as the display device of the embodiments corresponding to FIG. 13, but the area of a second boost electrode 3138t of a second semiconductor layer 1140 may be reduced. For example, a width of the second boost electrode 3138t of the second semiconductor layer 1140 in the second direction DR2 may be reduced compared to one or more of the previous embodiments. Accordingly, the width of the second boost electrode 3138t in the second direction DR2 may be substantially equivalent to or smaller than a width of a channel 3137 of a third transistor T3 in a first direction DR1 or a width of a channel 4137 of a fourth transistor T4 in the first direction DR1, but this is not restrictive.

Accordingly, the capacitance of the second capacitor Cbt may be further reduced, and dispersion in the luminance of the pixel due to the dispersion of the second capacitor Cbt may be reduced.

Although the embodiments of the present disclosure have been described in detail above, the scope of the present disclosure is not limited thereto, and various modifications and improvements by those skilled in the art using the basic concept of the present disclosure as defined in the following claims are also provided. is within the scope of the right.

| Description of symbols | |
|---|---|
| 110: substrate | 111: buffer layer |
| 127: first initialization voltage line | 128: second initialization voltage line |
| 141, 142, 143: gate insulation layer | 151: first scan line |
| 151t: first boost electrode | 152: second scan line |
| 152a: lower second scan line | 152b: upper second scan line |
| 153: initialization control line | 153a: lower initialization control line |
| 153b: upper initialization control line | 154: bypass control line |
| 161, 162, 163: interlayer insulation layer | |
| 171: data line | 172: driving voltage line |
| 180: protective layer | 741: common voltage line |
| 1130, 1140: semiconductor layer | 1131, 3136, 4136: first electrode |
| 1132, 3137, 4137: channel | 1133, 3138, 4138: second electrode |
| 1151, 1157, 1158, 3151,4151: gate electrode | |
| 1152, 1160, 1161, 1162, 1163, 1164, 1165, 1166, 1167, 1168, 1169, 1170, 1181, 1182, 1183: opening | |
| 1153: storage electrode | |
| 1171, 1172, 1173, 1174, 1175, 1176: connection electrode | |
| 1521: first portion | 1522: second portion |
| 1523: third portion | 3138t: second boost electrode |
| 3155, 4155: light blocking layer | 3156: connection portion |
| BML: light blocking layer | |

What is claimed is:

1. A display device comprising:
   a substrate;
   a first channel of a first transistor above the substrate;
   a first gate electrode overlapping the first channel;
   a storage electrode above the first gate electrode to form a first capacitor therewith;
   a first connection electrode above the storage electrode, and electrically connected with the first gate electrode;
   a third channel of a third transistor above the substrate; and
   a second scan line comprising a third gate electrode overlapping the third channel,
   wherein the third transistor comprises a second electrode electrically connected with the first connection electrode, and
   wherein the second scan line comprises:
      a first portion comprising the third gate electrode, and extending in a first direction;

a second portion bent from the first portion, and extending in a second direction, which is different from the first direction, in parallel with a first side of the storage electrode; and a third portion bent from the second portion, and extending in the first direction in parallel with a second side of the storage electrode.

2. The display device of claim 1, wherein the second scan line is separated from the first connection electrode in plan view.

3. The display device of claim 2, wherein an imaginary extension line of the first portion of the second scan line passes the storage electrode.

4. The display device of claim 2, wherein an imaginary extension line of the first portion of the second scan line passes the first connection electrode.

5. The display device of claim 4, wherein the first connection electrode comprises a portion extending in a direction that is oblique to the first direction and to the second direction.

6. The display device of claim 1, further comprising:
a first semiconductor layer above the substrate, and comprising the first channel; and
a second semiconductor layer above the first semiconductor layer, and comprising the third channel.

7. The display device of claim 6, wherein the second scan line comprises respective portions overlapping the first semiconductor layer and the second semiconductor layer.

8. The display device of claim 7, wherein the second portion of the second scan line overlaps the first semiconductor layer, and
wherein the first semiconductor layer has conductivity.

9. The display device of claim 6, further comprising:
a data line above the substrate;
a second transistor electrically connected with the data line; and
a first scan line comprising a second gate electrode overlapping a second channel of the second transistor, and a portion overlapping the second semiconductor layer.

10. The display device of claim 9, wherein a first boost electrode of the first scan line forms a second capacitor with a second boost electrode of the second semiconductor layer.

11. A display device comprising:
a substrate;
a first semiconductor layer comprising a first channel of a first transistor above the substrate;
a first gate conductive layer comprising a first gate electrode overlapping the first channel;
a second semiconductor layer above the first gate conductive layer, and comprising a third channel of a third transistor;
a third gate conductive layer comprising a second scan line comprising a third gate electrode overlapping the third channel; and
a first data conductive layer comprising a first connection electrode above the third gate conductive layer and electrically connected with the first gate electrode,
wherein the second scan line overlaps a first conductive area of the first semiconductor layer, and is separated from the first connection electrode in plan view.

12. The display device of claim 11, wherein the second scan line comprises:
a first portion comprising the third gate electrode, and extending in a first direction;

a second portion bent from the first portion, and extending in a second direction that is different from the first direction; and
a third portion bent from the second portion, and extending in the first direction.

13. The display device of claim 12, further comprising a storage electrode above the first gate electrode, and forming a first capacitor therewith,
wherein the second portion extends in parallel with a first side of the storage electrode, and
wherein the third portion extends in parallel with a second side of the storage electrode.

14. The display device of claim 13, wherein an imaginary extension line of the first portion of the second scan line passes the storage electrode.

15. The display device of claim 12, wherein the second portion of the second scan line overlaps the first semiconductor layer.

16. The display device of claim 11, further comprising:
a data line above the substrate;
a second transistor electrically connected with the data line; and
a first scan line comprising:
a second gate electrode overlapping a second channel of the second transistor; and
a portion overlapping the second semiconductor layer.

17. The display device of claim 16, wherein a first boost electrode of the first scan line forms a second capacitor with a second boost electrode of the second semiconductor layer.

18. The display device of claim 17, wherein the second boost electrode of the second semiconductor layer is electrically connected with the first connection electrode.

19. A display device comprising:
a substrate;
a first channel of a first transistor above the substrate;
a first gate electrode overlapping the first channel;
a first connection electrode electrically connected with the first gate electrode;
a third channel of a third transistor above the substrate; and
a second scan line comprising a third gate electrode overlapping the third channel,
wherein the third transistor comprises a second electrode electrically connected with the first connection electrode,
wherein the second scan line is separated from the first connection electrode in plan view, and comprises:
a first portion comprising the third gate electrode, and extending in a first direction;
a second portion bent from the first portion, and extending in a second direction that is different from the first direction; and
a third portion bent from the second portion, and extending in the first direction, and
wherein an imaginary extension line of the first portion of the second scan line passes the first connection electrode.

20. The display device of claim 19, further comprising a storage electrode above the first gate electrode to form a first capacitor therewith,
wherein the imaginary extension line of the first portion of the second scan line passes the storage electrode.

* * * * *